(12) United States Patent
Sogou et al.

(10) Patent No.: US 11,145,484 B2
(45) Date of Patent: Oct. 12, 2021

(54) GAS CLUSTER ION BEAM APPARATUS AND ANALYZING APPARATUS

(71) Applicant: ULVAC-PHI, INC, Chigasaki (JP)

(72) Inventors: Mauo Sogou, Chigasaki (JP);
Hiromichi Yamazui, Chigasaki (JP);
Daisuke Sakai, Chigasaki (JP);
Katsumi Watanabe, Chigasaki (JP)

(73) Assignee: ULVAC-PHI, INC, Kanagawa (JP)

( * ) Notice: Subject to any disclaimer, the term of this patent is extended or adjusted under 35 U.S.C. 154(b) by 44 days.

(21) Appl. No.: 16/831,082

(22) Filed: Mar. 26, 2020

(65) Prior Publication Data

US 2020/0312604 A1 Oct. 1, 2020

(30) Foreign Application Priority Data

Mar. 27, 2019 (JP) .............................. JP2019-061228

(51) Int. Cl.
*H01J 37/08* (2006.01)

(52) U.S. Cl.
CPC ......... *H01J 37/08* (2013.01); *H01J 2237/002* (2013.01)

(58) Field of Classification Search
CPC ........................... H01J 37/08; H01J 2237/002
See application file for complete search history.

(56) References Cited

U.S. PATENT DOCUMENTS

| | | |
|---|---|---|
| 5,459,326 A | 10/1995 | Yamada |
| 2001/0054686 A1 | 12/2001 | Torti et al. |
| 2002/0139772 A1 | 10/2002 | Fenner |
| 2011/0147609 A1* | 6/2011 | Shichi ................... H01J 27/022 250/400 |
| 2012/0199758 A1* | 8/2012 | Kawanami .............. H01J 27/26 250/397 |

(Continued)

FOREIGN PATENT DOCUMENTS

| | | |
|---|---|---|
| JP | H04-354865 A | 12/1992 |
| JP | 2006-156065 A | 6/2006 |

(Continued)

OTHER PUBLICATIONS

Yamada et al.; "Materials processing by gas cluster ion beams;" Reports: A Review Journal; Materials Science and Engineering R 34; 2001; pp. 231-295.

(Continued)

*Primary Examiner* — Sean M Luck
(74) *Attorney, Agent, or Firm* — Oliff PLC

(57) ABSTRACT

An analyzing apparatus includes a sample chamber, a measurement apparatus, and a gas cluster ion beam apparatus. A cooling body separates an ionization chamber of the gas cluster ion beam apparatus from a nozzle support to prevent heat emitted by an ionization filament from being transmitted to the nozzle support, and a temperature of a source gas emitted from a nozzle is kept at a constant temperature by a gas heating device while a sputtering rate is kept constant. A pressure of the source gas supplied to the nozzle is kept at constant pressure by a pressure controller, and a size of gas cluster ions is kept at a constant value. Because the sputtering rate is a constant value, highly accurate depth surface profiling can be performed.

10 Claims, 6 Drawing Sheets

(56) References Cited

U.S. PATENT DOCUMENTS

| | | | | |
|---|---|---|---|---|
| 2015/0206732 A1* | 7/2015 | Sakai | ............... | H01J 49/0468 |
| | | | | 378/64 |
| 2016/0225575 A1* | 8/2016 | Muto | ............... | H01J 37/1474 |
| 2017/0323764 A1* | 11/2017 | Muto | ............... | H01J 27/26 |
| 2018/0012726 A1* | 1/2018 | Shichi | ............... | H01J 37/28 |

FOREIGN PATENT DOCUMENTS

| | | |
|---|---|---|
| JP | 3865513 B2 | 1/2007 |
| JP | 2008-116363 A | 5/2008 |

OTHER PUBLICATIONS

Boldarev et al.; "Gas-cluster targets for femtosecond laser interaction: Modeling and optimization;" Review of Scientific Instruments; vol. 77; 2006; 083112; pp. 1-10.

Aug. 7, 2020 extended European Search Report issued in European Patent Application No. 20164406.9.

Hagena et al. "Cluster Formation in Expanding Supersonic Jets: Effet of Pressure, Temperature, Nozzle Size, and Test Gas." The Journal of Chemical Physics, vol. 56, pp. 1793-1802, 1972.

\* cited by examiner

GAS CLUSTER ION BEAM APPARATUS AND ANALYZING APPARATUS

CROSS-REFERENCE TO RELATED APPLICATION

This application claims priority from Japanese Patent Application No. 2019-061228, filed with the Japanese Patent Office on Mar. 27, 2019, the entire content of which is hereby incorporated by reference.

BACKGROUND

Technical Field

The present invention relates to a gas cluster ion beam apparatus for surface analysis, and more specifically relates to an apparatus and a technique for achieving control of a cluster size and stability of beam current in the gas cluster ion beam apparatus.

Related Art

Conventionally, a gas cluster ion beam (GCIB) gun is used for surface treatment such as cleaning, smoothing, doping, and etching of a surface of a substrate. In particular, in a field of a surface analyzing apparatus, the GCIB gun is widely used as a low-damage sputtering gun.

A gas cluster is an aggregate of tens to thousands of gas molecules. Gas ejected from a nozzle is aggregated by adiabatic expansion, thereby generating a gas cluster. The gas cluster is ionized by means of electron impact, or the like, to generate gas cluster ions.

The gas cluster ions are accelerated and focused by an electric field, and are irradiated on a sample. Energy per gas molecule is energy obtained by dividing acceleration voltage by the number of molecules constituting the gas cluster. For this reason, damage to the sample surface becomes very small compared with other ions which are used in the surface treatment, such as Ar monoatomic ions, Ga atomic ions, etc.

In order to adapt the GCIB gun as a sputtering ion gun for use in the field of the surface analyzing apparatus, it is necessary to control beam current and a cluster size.

The surface analyzing apparatus performs depth profiling using a sputtering ion gun. Depth profiling is a method of acquiring information about a state of a sample at each depth by repeatedly sputtering the surface of the sample with the sputtering ion gun and measuring a physical quantity of the surface. In addition, depth profiling is a method of estimating a distribution of the state in the depth direction by keeping the speed at which the sample is sputtered by the sputtering ion gun constant.

In the GCIB gun, the speed at which the sample is sputtered mainly depends on beam current and a cluster size.

For this reason, it is important to control the beam current and the cluster size in the GCIB gun for the surface analyzing apparatus. Also, the GCIB gun has been used mainly for analyzing an organic sample with low damage. In recent years, it is required to analyze an inorganic sample with low damage by reducing the cluster size in the GCIB gun.

Currently, control of the cluster size is achieved by controlling the pressure of introduced gas or by using a mass filter.

However, current GCIB guns do not control cluster size and beam current by controlling a temperature of source gas and the temperature of an ionization chamber.

SUMMARY

An object of the present invention is to achieve depth profiling of various types of samples made of an organic or inorganic material, or a composite thereof, while suppressing damage in various types of surface analyses.

In order to solve the above-mentioned problems, an embodiment provides an analyzing apparatus including a sample chamber configured to receive a sample, a measurement apparatus configured to measure a physical quantity of a surface of the sample, a gas cluster ion beam apparatus configured to emit a gas cluster ion beam on the sample. The gas cluster ion beam apparatus includes an ionization chamber configured so that a gas cluster formed by ejecting source gas from an ejection hole of a nozzle supported by a nozzle support travels, an ionization filament configured to emit thermoelectrons when heated and to irradiate the gas cluster travelling in the ionization chamber with the thermoelectrons so as to generate gas cluster ions, a cooling body, the nozzle support and the ionization chamber being in contact with the cooling body, and separated from each other, a cooling device configured to cool the cooling body to a predetermined temperature, a gas pipe configured to supply the source gas to the nozzle, a gas heating device configured to heat the source gas, and a main controller configured to control the heat generation of the gas heating device. While a temperature of the source gas ejected from the nozzle is controlled by the main controller, the gas cluster ion beam containing the generated gas cluster ions is ejected outside the ionization chamber and is irradiated on the sample arranged in the sample chamber.

In an embodiment, the analyzing apparatus controls a temperature of the cooling body by a main controller.

In an embodiment, the analyzing apparatus controls pressure, with a pressure controller, of the source gas supplied to the nozzle.

In an embodiment, the analyzing apparatus includes a vacuum-exhausted ejection tank within the analyzing apparatus and with the nozzle support, and a vacuum-exhausted ionization tank within the analyzing apparatus with the ionization chamber. The ejection tank and the ionization tank are not in contact with each other, but are in contact with the cooling body.

In an embodiment, the analyzing apparatus includes a cooling medium cooled by the cooling device and circulated through the cooling body in order to cool the cooling body.

In an embodiment, a gas cluster ion beam apparatus includes an ionization chamber configured so that a gas cluster formed by ejecting source gas from an ejection hole of a nozzle supported by a nozzle support travels, an ionization filament configured to emit thermoelectrons when heated and to irradiate the gas cluster travelling in the ionization chamber with the thermoelectrons so as to generate gas cluster ions The gas cluster ion beam apparatus includes a cooling body, the nozzle support and the ionization chamber being in contact with the cooling body, and separated from each other, a cooling device configured to cool the cooling body to a predetermined temperature. The gas cluster ion beam apparatus further includes a gas pipe configured to supply the source gas to the nozzle, a gas heating device configured to heat the source gas, and a main controller configured to control the heat generation of the gas heating device. While a temperature of the source gas ejected from the nozzle is controlled by the main controller, the gas cluster ion beam containing the generated gas cluster ions is ejected outside the ionization chamber and is irradiated on the sample arranged in the sample chamber.

In an embodiment, a temperature of the cooling body is controlled by the main controller. Also, the gas cluster ion beam apparatus includes a pressure controller configured to control pressure of the source gas supplied to the nozzle.

In an embodiment, the gas cluster ion beam apparatus includes a vacuum-exhausted ejection tank with a nozzle support, and a vacuum-exhausted ionization tank provided therein with the ionization chamber, wherein the ejection tank and the ionization tank are not in contact with each other, but are in contact with the cooling body.

In an embodiment, the gas cluster ion beam apparatus includes a cooling medium cooled by the cooling device and circulated through the cooling body to cool the cooling body.

DETAILED DESCRIPTION

Figure 1:
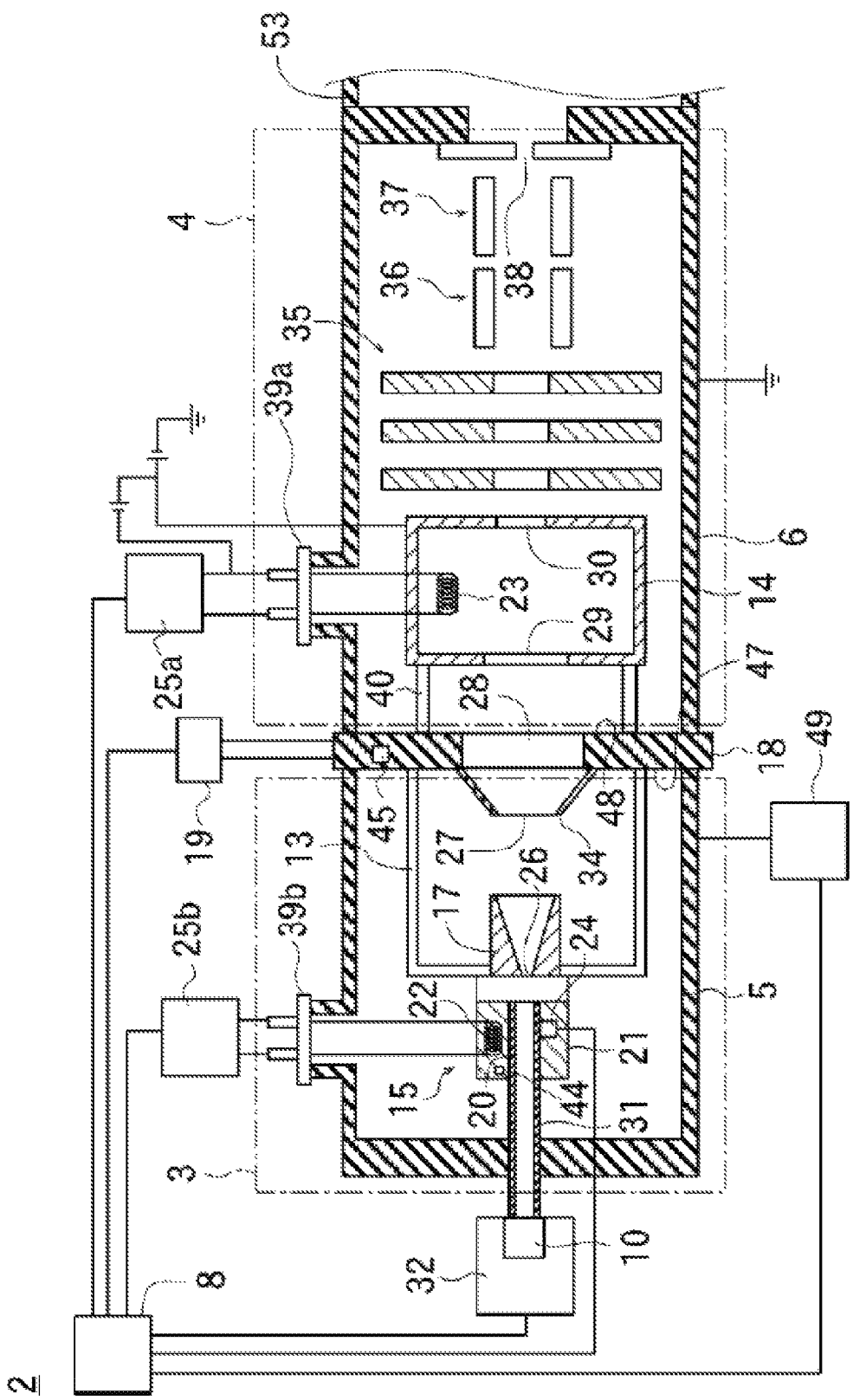
FIG. 1 illustrates a gas cluster ion beam apparatus according to an embodiment of the present invention.

According to the above-discussed embodiments, because the temperature of the source gas supplied to the nozzle is equal to the temperature of the source gas ejected from the nozzle, the source gas supplied to the nozzle is heated by heating a proximity portion close to the nozzle, the portion being among portions of a gas pipe which are arranged in an ejection tank, thereby the source gas ejected from the nozzle is heated.

Therefore, by measuring the temperature of the proximity portion and controlling the temperature of the proximity portion so that the temperature may be kept at a constant temperature, the temperature of the source gas supplied to the nozzle is controlled, the source gas ejected from the nozzle is thus controlled, and the value of the size of the gas cluster ions is kept constant.

Further, in a case in which the pressure at which the source gas is ejected from an ejection hole is controlled so that the pressure may be kept at constant pressure, the value of the gas cluster size is further kept constant.

Since the value of the size of the gas cluster ions and the current value of the gas cluster ion beam can be kept constant, the sputtering rate for the sample is stabilized, and highly accurate depth profiling can be performed.

The principle of control of a cluster size of a gas cluster ion beam (GCIB) will be described.

(1) Gas Cluster Size

A gas cluster size N is expressed by (Equation 1) described below.

$$N = 33(\Gamma^*/1000)^{2.35} \qquad \text{(Equation 1)}$$

where $\Gamma^* = k_h (0.74 d/\tan \alpha)^{0.85} P_0 T_0^{-2.29}$ $k_h$ is a constant depending on the gas type of source gas from which a beam is to be generated (for example, $k_h = 1650$ for Ar, $k_h = 2890$ for Kr), d is a diameter of a nozzle, $\alpha$ is a semi-angle of a nozzle aperture angle, $P_0$ is pressure of the source gas, and $T_0$ is a temperature of the source gas (Boldarev, A. S., et al., Rev. Sci. Instr. 77, 083112 (2006), Equations (1), (2)). The pressure $P_0$ is a pressure at which the source gas passes through the nozzle outlet.

It is apparent from (Equation 1) described above that, in a case in which the nozzle diameter is not changed, and in which the gas cluster is composed of a single kind or the composition ratio of the gas cluster is constant, the gas cluster size N can be controlled by controlling a value of the pressure $P_0$ of the source gas and a value of the temperature $T_0$ of the source gas.

(2) GCIB Beam Current

A current value of the gas cluster ion beam is controlled by a generation amount of the neutral gas cluster and the ionization efficiency of the gas cluster.

Intensity I of the neutral gas cluster ion beam is expressed by (Equation 2).

$$I \propto P_0 d (T_b/T_0)^{(\gamma/(\gamma-1))} \qquad \text{(Equation 2)}$$

$T_b$ is a boiling point of the source gas, and $\gamma$ is specific heat ratio of the source gas (for argon gas, $T_b$ is 87.30K, and $\gamma$ is 4.987 [cal/mol·° C.]). (Materials Science and Engineering R 34 (2001) 231-295. (Equation 2.6))

It is apparent from (Equation 2) described above that, in a case in which the nozzle diameter d is not changed by the pressure $P_0$ and the temperature $T_0$ of the source gas and in which a gas of a single kind or a mixed gas of a constant composition ratio is used for the source gas, the generation amount of the gas cluster can be controlled by controlling the pressure $P_0$ and the temperature $T_0$ of the source gas.

The ionization efficiency in a case of ionizing the source gas by means of electron impact, as is in the case of ionizing Ar atoms, can be controlled by emission current flowing through an ionization filament that generates thermoelectrons and having an ionization voltage that accelerates the electrons.

The ionization efficiency in a case of ionizing the gas cluster by means of electron impact can be controlled by controlling the gas cluster size N as well as the emission current and the ionization voltage. The reason for this is because the ionization efficiency of the gas cluster is proportional to a cross-sectional area of the gas cluster, that is, proportional to ⅔ power of the gas cluster size N. Here, since the gas cluster size N is expressed by (Equation 1) and is controllable, the ionization efficiency of the gas cluster can also be controlled (Materials Science and Engineering R 34 (2001) 231-295. (FIG. 9)).

(3) Temperature Control Method

To control the temperature $T_0$ of the source gas at the time of adiabatic expansion during the gas cluster generation process, it is effective to control the temperature of the source gas immediately before the source gas is ejected from the nozzle.

In other words, by controlling the temperature of a portion of the gas introduction path through which the source gas passes immediately before reaching the nozzle, the temperature of the source gas at the time of adiabatic expansion can be controlled, and the apparatus can be downsized.

To control the temperature of the source gas, not only heating, but also cooling is important. The reason for this is because it is difficult to lower the temperature of the nozzle, as the nozzle heated by a heater is difficult to cool down in a vacuum. By cooling the nozzle and a nozzle support on which the nozzle is arranged, the source gas at the time of being ejected from the nozzle can be cooled. Thus, stable ionization of cluster ions can be achieved.

Keeping the temperature of an ionization chamber low contributes to a longer life of the ionization filament because contamination and damage of the ionization filament are reduced. In addition, it is possible to suppress the fluctuation of the intensity of the gas cluster ion beam immediately after the startup caused by an influence of heat.

A gas cluster ion beam apparatus 2 according to an embodiment of the present invention in FIG. 1 includes an ejection unit 3, an ionization unit 4, and a cooling body 18. The ejection unit 3 includes an ejection tank 5 in which a vacuum environment is formed, and the ionization unit 4 includes an ionization tank 6 in which a vacuum environment is formed. A nozzle support 13 is arranged inside the ejection tank 5, and an ionization chamber 14 is arranged inside the ionization tank 6.

The cooling body 18 is formed in an annular flat-plate shape and a passing hole 28 as a through hole is provided at a center of the cooling body 18.

Among the four surfaces of the cooling body 18, an outer circumferential side surface and an inner circumferential side surface are curved, and the other two surfaces are flat. Each of the ejection tank 5, the ionization tank 6, the nozzle support 13, and the ionization chamber 14 is formed in a cylindrical shape. An edge of an opening of the ejection tank 5 and an edge of an opening of the nozzle support 13 are connected to a same first surface 47, between two surfaces of broad flat-plate-shape of the cooling body 18.

On the other hand, an edge of an opening of the ionization tank 6 is connected to a second surface 48 opposite to the first surface 47 to which the edge of the opening of the ejection tank 5 is connected, between two surfaces of flat-plate-shape of the cooling body 18.

The ionization chamber 14 is fixed to the second surface 48 of the cooling body 18, the second surface 48 is connected to the edge of the opening of the ionization tank 6, via a ceramic support 40.

Accordingly, the nozzle support 13 is fixed to the first surface 47 of the cooling body 18, and the ionization chamber 14 is fixed to the opposite second surface 48 via the ceramic support 40.

Here, the nozzle support 13 is fixed to the cooling body 18 and is fixed to the ejection tank 5 by a not-illustrated member. The weight of the nozzle support 13 is supported by the ejection tank 5 and the cooling body 18.

A gas source 32 filled with source gas is arranged outside the ejection tank 5 and the ionization tank 6. Here, argon gas is used as the source gas, and gas, such as other rare gas, nitrogen gas, and oxygen gas can be used.

The ejection tank 5 and the nozzle support 13 are bottomed, and a gas pipe 31 connected to the gas source 32 is hermetically inserted into a bottom surface of the ejection tank 5, a nozzle 17 arranged inside the nozzle support 13 is fixed to a bottom surface of the nozzle support 13, and a tip of the gas pipe 31 is connected to the nozzle 17 on the bottom surface of the nozzle support 13.

The gas cluster ion beam apparatus 2 includes a main controller 8, and operation of the gas source 32 is controlled by the main controller 8 so that pressure-controlled source gas may be supplied to the nozzle 17.

The nozzle 17 is provided with an ejection hole 26 which connects the inside of the gas pipe 31 to the inside of the nozzle support 13.

A vacuum exhaust device 49 is connected to at least either one of the ejection tank 5 or the ionization tank 6. The vacuum exhaust device 49 is controlled by the main controller 8. When the vacuum exhaust device 49 is controlled by the main controller 8 and is operated, the insides of the ejection tank 5, the ionization tank 6, the nozzle support 13, and the ionization chamber 14 are vacuum-exhausted to create a vacuum environment. When the gas source 32 is operated by the main controller 8 and the source gas passes through the gas pipe 31 and is supplied to the nozzle 17, the source gas is ejected from the ejection hole 26 into the vacuum environment formed inside the nozzle support 13.

The molecules or atoms of the source gas ejected from the nozzle 17 have the same velocity due to adiabatic expansion, the source gas particles composed of the molecules or atoms of the source gas are translated, have high density, and aggregate due to van der Waals forces, and a neutral gas cluster is generated.

A skimmer 34 having a through hole 27 is attached to the first surface 47 to which the edge of the opening of the ejection tank 5 and the edge of the opening of the nozzle support 13 are connected, the first surface 47 being one of the two broad first and second surfaces 47, 48 of the cooling body 18.

The through hole 27 is located inside the nozzle support 13, and the ejection hole 26 of the nozzle 17 is faced to the through hole 27.

The ejection hole 26, the through hole 27, and the passing hole 28 are arranged in a straight line so that central axes thereof may coincide with each other. A peripheral portion of the flow of the formed neutral gas cluster is removed by the skimmer 34, and a central portion of the flow of the formed neutral gas cluster is shaped into a beam shape and passes through the through hole 27 and the passing hole 28.

Among walls of the ionization chamber 14, an inlet hole 29 is formed in a wall on a cooling body 18 side, and an outlet hole 30 is formed on an opposite side of the wall. The inlet hole 29 is arranged to be faced to the passing hole 28 and is located in a traveling direction of the gas cluster beam.

An ionization filament 23 is arranged between the wall of the ionization chamber 14 in which the inlet hole 29 is formed and the wall of the ionization chamber 14 in which the outlet hole 30 is formed.

A heating power supply 25a is arranged outside the ionization tank 6, and the ionization tank 6 is provided with a thermoelectron introduction terminal 39a. The ionization filament 23 is electrically connected to the heating power supply 25a via the thermoelectron introduction terminal 39a, and when the heating power supply 25a starts operating by means of the main controller 8, current is supplied from the heating power supply 25a to the ionization filament 23. The current flows through the ionization filament 23, and the ionization filament 23 is heated.

The ejection tank 5, the ionization tank 6, and the nozzle support 13 are connected to ground potential, and the ionization chamber 14 is insulated from the ground potential by the ceramic support 40. Acceleration voltage (positive voltage) is applied to the ionization chamber 14 while ionization voltage (negative voltage) based on the acceleration voltage is applied to the ionization filament 23, and when the ionization filament 23 is heated to reach a predetermined temperature, thermoelectrons are emitted from the ionization filament 23 into the ionization chamber 14.

The gas cluster formed into a beam shape by the skimmer 34 enters the inside of the ionization chamber 14 from the inlet hole 29 and is irradiated with emitted thermoelectrons while traveling inside the ionization chamber 14, and when the gas cluster collides with the thermoelectrons, the gas cluster is ionized to cause gas cluster ions to be generated.

An extraction electrode 35 is arranged outside a portion of the ionization chamber 14 at which the outlet hole 30 is located.

The generated gas cluster ions are attracted by extraction voltage (negative voltage) based on acceleration voltage applied to the extraction electrode 35, are extracted out of the ionization chamber 14 as a gas cluster ion beam from the outlet hole 30, and the gas cluster ion beam is further accelerated by the acceleration voltage.

A Wien filter 36 and a bend electrode 37 are arranged in this order toward travelling direction of the accelerated gas cluster ion beam. Voltage applied to the Wien filter 36 and voltage applied to the bend electrode 37 are controlled by the main controller 8. Ar monomer ions (atomic ions) of the gas cluster ions in the gas cluster ion beam are removed by the voltage applied to the Wien filter 36, the travelling direction of the gas cluster ions is bent by the voltage applied to the bend electrode 37 to cause neutral gas particles to be removed, and the gas cluster ion beam containing ions of a single type passes through an aperture hole 38. When the gas cluster ion beam that has passed through the aperture hole 38 is emitted from the gas cluster ion beam apparatus 2 and is irradiated on a sample, the surface of the sample is sputtered.

Figure 2:
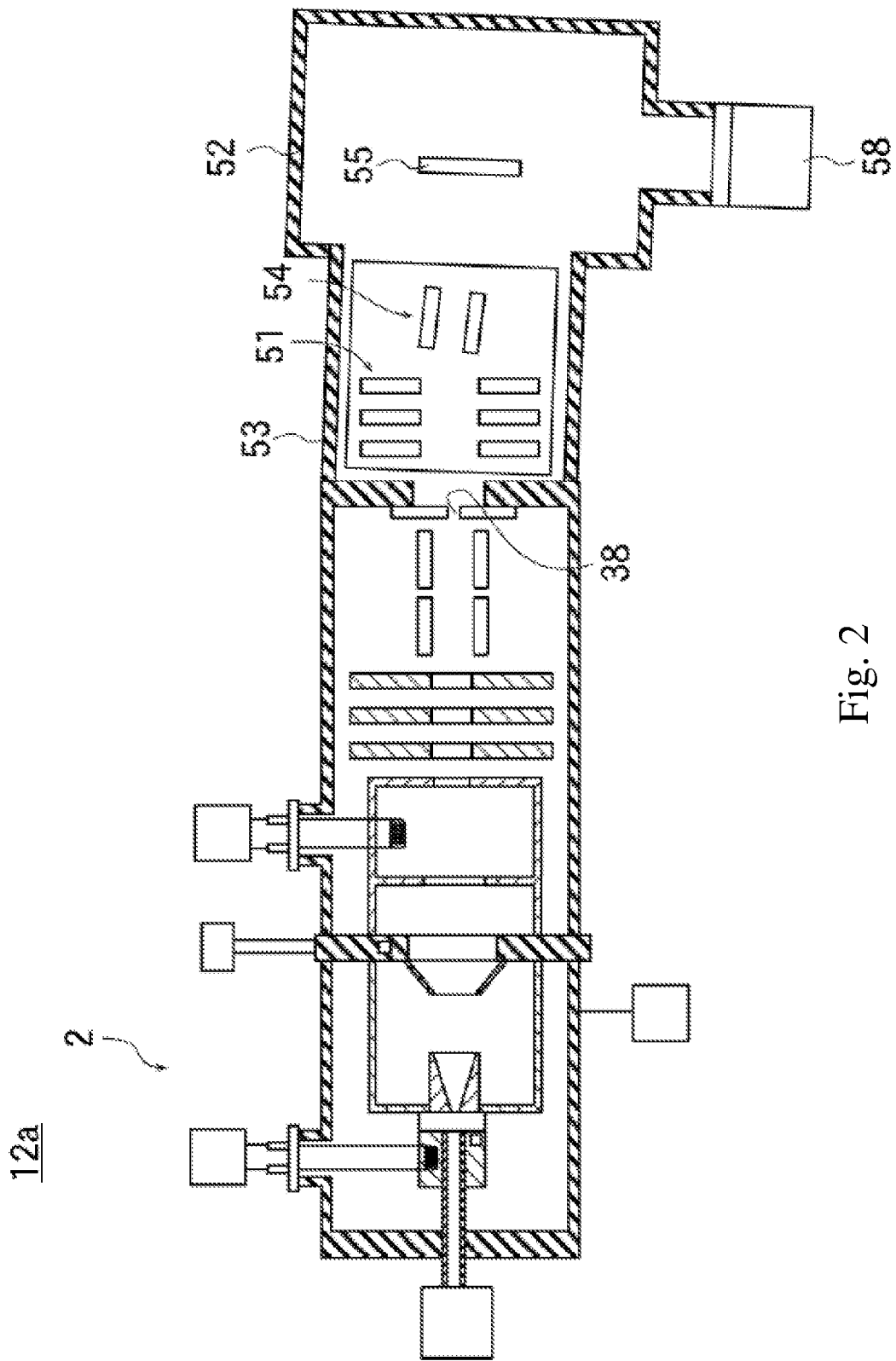
FIG. 2 illustrates an example of a sputtering apparatus including the gas cluster ion beam apparatus.
Figure 3:
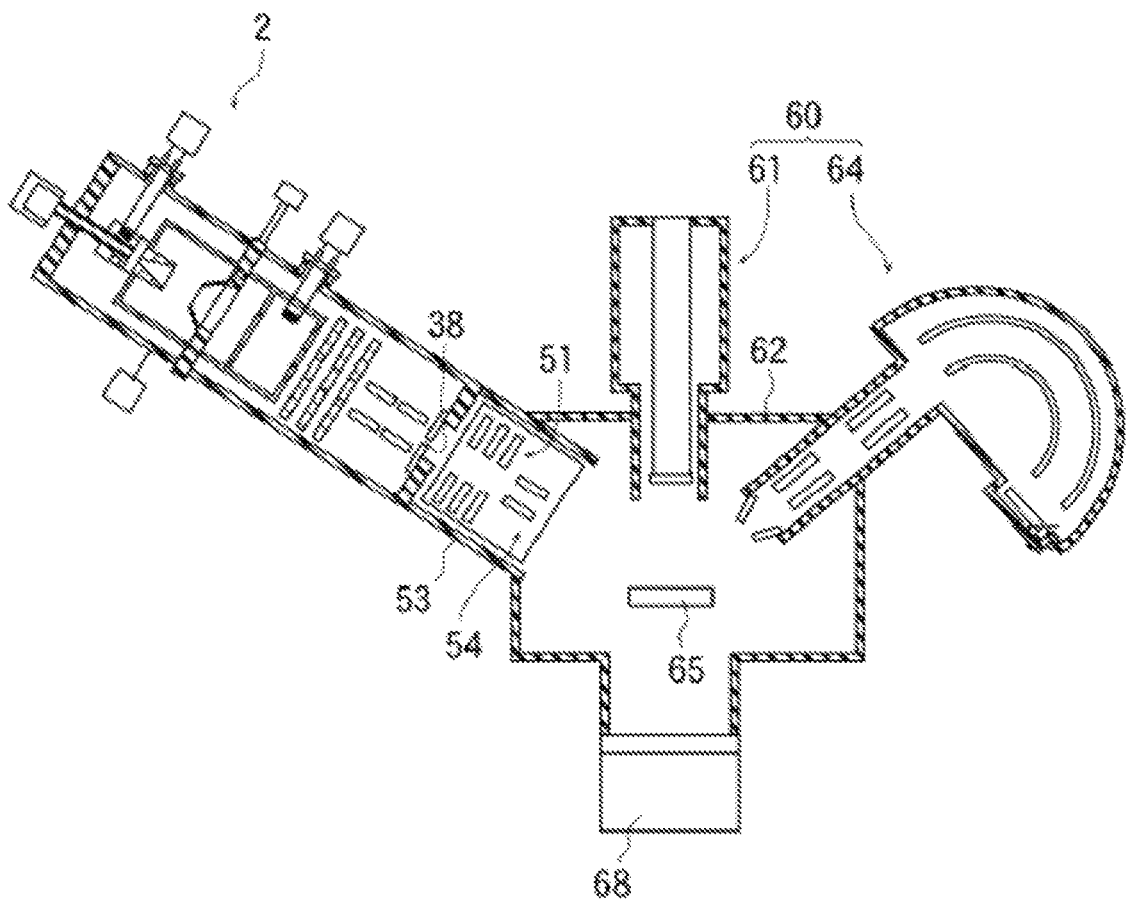
FIG. 3 illustrates an example of an analyzing apparatus including the gas cluster ion beam apparatus.
Figure 4:
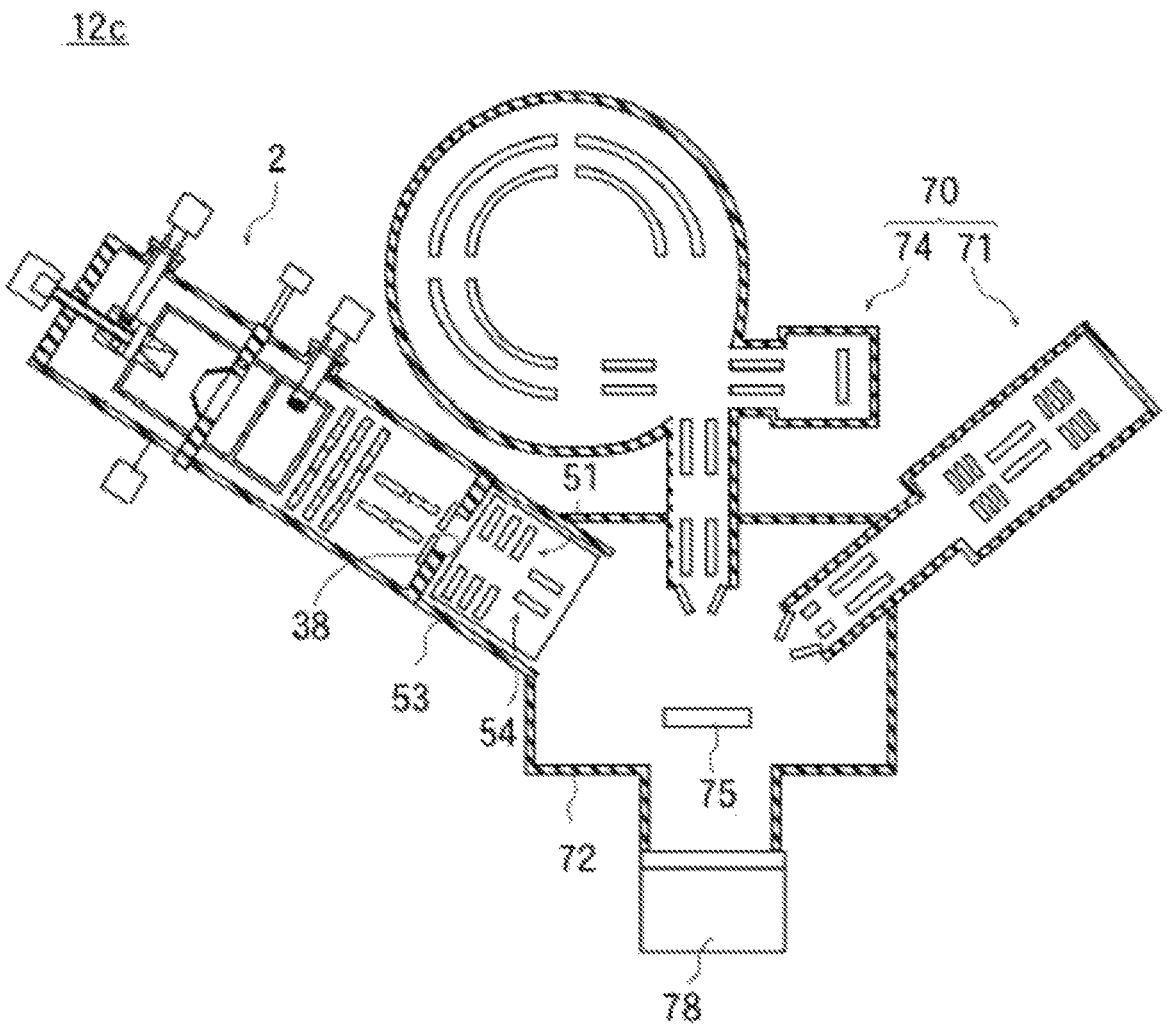
FIG. 4 illustrates another example of an analyzing apparatus including the gas cluster ion beam apparatus.

FIG. 2 illustrates an example of a sputtering apparatus 12a including the aforementioned gas cluster ion beam apparatus 2, and FIGS. 3 and 4 illustrate examples of analyzing apparatuses 12b and 12c including the aforementioned gas cluster ion beam apparatus 2. In FIG. 2, and FIGS. 3 and 4 described below, electric connection between the main controller 8 and devices controlled by the main controller 8 is omitted.

In the sputtering apparatus 12a in FIG. 2 and the analyzing apparatuses 12b and 12c in FIGS. 3 and 4, a focusing/deflecting tank 53 is arranged further on the downstream side of the gas cluster ion beam than the aperture hole 38.

Inside the focusing/deflecting tank 53, a focusing lens 51 and a deflection electrode 54 are arranged. Voltage and current to be applied to the focusing lens 51 and voltage and current to be applied to the deflection electrode 54 are controlled by the main controller 8. The focusing/deflecting tank 53 is arranged at a position on which the gas cluster ion beam passing through the aperture hole 38 is incident, and the gas cluster ion beam emitted from the gas cluster ion beam apparatus 2 enters the focusing/deflecting tank 53, is focused by the focusing lens 51, is adjusted in terms of the travelling direction by the deflection electrode 54, and is irradiated on a sample 55, 65, or 75. Here, the size and shape of the irradiation area on each of the samples 55, 65, and 75 can be controlled by the deflection electrode 54.

A sample chamber 52, 62, or 72 is arranged in the traveling direction of the bent gas cluster ion beam. The sample chambers 52, 62, and 72 are vacuum-exhausted by vacuum exhaust devices 58, 68, and 78 to form vacuum environment.

The samples 55, 65, and 75 are arranged inside the sample chambers 52, 62, and 72, respectively, and the gas cluster ion beam incident on the inside of the sample chambers 52, 62, and 72 is applied to the surfaces of the samples 55, 65, and 75. The surfaces of the samples 55, 65, and 75 are sputtered to cause new surfaces to be exposed in the vacuum environment.

Therefore, in a case in which the sample chambers 52, 62, and 72 are provided with analyzing apparatuses for analyzing the surfaces of the samples 55, 65, and 75, depth profiling of the samples 55, 65, and 75 can be performed.

Meanwhile, when the ionization filament 23 generates heat, the temperature of the ionization chamber 14 in which the ionization filament 23 is arranged rises to a high temperature. When the temperature of the ionization chamber 14 rises, the temperature of the ionization tank 6 also rises due to heat radiation of the ionization chamber 14. Therefore, in a case in which there is heat conduction between the ionization chamber 14 and the nozzle support 13 and between the ionization tank 6 and the ejection tank 5, the temperatures of the nozzle support 13 and the ejection tank 5 will rise.

The ejection tank 5, the ionization tank 6, the nozzle support 13, and the ceramic support 40 are in contact with the cooling body 18, and the weight of the ionization chamber 14 is supported by the cooling body 18 via the ceramic support 40.

The ionization chamber 14 is not in contact with the ejection tank 5 and the nozzle support 13, and the ionization tank 6 is not in contact with the ejection tank 5 and the nozzle support 13. In short, the nozzle support 13 is thermally separated from the ionization chamber 14 and the ionization tank 6 so that heat may not be transmitted due to heat conduction from the ionization chamber 14 and the ionization tank 6 to the nozzle support 13.

The cooling body 18 is connected to a cooling device 19, and a liquid cooling medium is supplied from the cooling device 19. A liquid passage formed of a cavity is provided inside the cooling body 18, and the cooling medium supplied to the cooling body 18 flows through the liquid passage and performs heat exchange to cool the cooling body 18. After the temperature of the cooling medium rises, the cooling medium returns to the cooling device 19, is cooled, and is repeatedly supplied to the cooling body 18. The cooling medium is, for example, cooling water.

The cooling body 18 is provided with a cooling temperature sensor 45. The temperature of the cooling body 18 is measured by the cooling temperature sensor 45 and the main controller 8 controls the temperature of the cooling medium cooled by the cooling device 19 so that the cooling body 18 may hold a preset setting temperature.

However, the temperature of the cooling medium may be measured by the main controller 8 using a sensor provided in the cooling device 19, and the main controller 8, may set the temperature of the cooling body 18 to be the setting temperature by operating the cooling device 19 so that the temperature of the cooling medium may be a temperature which is stored in advance. As a result, the cooling body 18 is cooled below room temperature, and even in a case in which the ionization chamber 14 and the ionization tank 6 are heated to a high temperature, heat is not conducted to the nozzle support 13.

The gas source 32 is provided with a pressure controller 10. A pressure value of the source gas is set in the main controller 8, and the pressure controller 10 controls the pressure value of the source gas supplied from the gas source 32 to the nozzle 17 so that the pressure value of the source gas supplied from the gas source 32 to the nozzle 17 may be the pressure value set in the main controller 8.

The gas pipe 31 is provided with a gas heating device 15 for heating the gas pipe 31. Here, the gas heating device 15 includes a metal block 21 that is in contact with the gas pipe 31 and a resistance heating heater 22 that heats the metal block 21. A heating power supply 25b is arranged outside the ejection tank 5, and the resistance heating heater 22 is electrically connected to the heating power supply 25b via a current introduction terminal 39b.

Electric power to be output from the heating power supply 25b is controlled by the main controller 8, and when the resistance heating heater 22 is energized and generates heat, the gas pipe 31 is heated.

The temperature of a proximity portion 20, which is a portion in the vicinity of a portion of the gas pipe 31 connected to the nozzle 17, is equal to the temperature of a portion of the nozzle 17 surrounding the ejection hole 26, and by controlling the temperature of the proximity portion 20, the temperature of the ejection hole 26 of the nozzle 17 is controlled. Here, the proximity portion 20 is arranged inside the metal block 21, and the outer circumference of the proximity portion 20 is in contact with the metal block 21.

The resistance heating heater 22 is arranged inside the metal block 21. When the resistance heating heater 22 generates heat, the metal block 21 is heated, the proximity portion 20 is heated by the heated metal block 21, and the temperature of the proximity portion 20 rises. The source gas flowing inside the proximity portion 20 is heated by the heated proximity portion 20. In this manner, the source gas is heated by the gas heating device 15. The proximity portion 20 is provided with a temperature sensor 24 connected to the main controller 8, and the main controller 8 measures the temperature of the proximity portion 20 using the temperature sensor 24 and heats the resistance heating heater 22 by controlling the heating power supply 25b so that a measured temperature may correspond to a stored predetermined temperature. Here, the ejection tank 5 and the nozzle support 13 are in contact with and cooled by the cooling body 18 cooled to a temperature lower than room temperature (here, 27° C.). Thus, when the heating power supply 25b is stopped while the cooling body 18 is being cooled, the peripheries of the proximity portion 20 and the ejection hole 26 are cooled to a temperature lower than room temperature.

When the resistance heater 22 is energized by the heating power supply 25b and generates heat when the cooling body 18 is cooled to 0° C. or less, the proximity portion 20 can hold a temperature in a range of 0° C. or more and 300° C. or less.

To make the size of the gas cluster suitable for surface profiling, it is desirable to set the temperature of the source gas ejected from the nozzle 17 to a constant temperature in a range of 10° C. or more and 100° C. or less. By controlling heat generation of the gas heating device 15 by means of the main controller 8 and maintaining the temperature of the proximity portion 20 at a constant temperature in a range of 10° C. or more and 100° C. or less, the temperature of the source gas ejected from the nozzle 17 can be set to a constant temperature in a range of 10° C. or more and 100° C. or less.

The room temperature is stored in the main controller 8 as a predetermined temperature, the resistance heating heater 22 is energized while the current is controlled by the main controller 8, and the temperature of the proximity portion 20 can be close to the room temperature. Also, the pressure of the source gas supplied to the nozzle 17 is controlled by the pressure controller 10 so that the pressure of the source gas supplied to the nozzle 17 may be kept at predetermined pressure. The temperature of the source gas ejected from the nozzle 17 does not change even when the temperature of the ionization chamber 14 or the ionization tank 6 changes, and the pressure of the source gas ejected from the nozzle 17 does not change even when the pressure of the source gas filled in the gas source 32 changes.

For this reason, since the gas cluster ion beam intensity (current value of the gas cluster ion beam) and the size of the gas cluster ions are maintained at constant values, the sputtering rates for the samples 55, 65, and 75 irradiated with the gas cluster ion beams are also maintained at constant values.

The pressure controller 10 can set the pressure of the source gas to be supplied to a value in a range of 200 kPa or more and 2 MPa or less, and to make the size of the gas cluster stable and appropriate, it is desirable to set the pressure of the source gas to be supplied to a constant value in a range of 300 kPa or more and 1000 kPa or less. Here, the flow rate of the source gas is set to 5 to 300 ccm. The pressure controller 10 controls the source gas pressure when the source gas passes through the ejection hole 26, by controlling the pressure of the source gas to be supplied.

FIGS. 3 and 4 illustrate examples of the analyzing apparatuses 12b and 12c including the aforementioned gas cluster ion beam apparatus 2. The sample chambers 62 and 72 are provided with measurement apparatuses 60 and 70, respectively, for performing surface profiling of the samples 65 and 75. The measurement apparatuses 60 and 70 are controlled by the main controller 8.

The measurement apparatus 60 in the analyzing apparatus 12b in FIG. 3 includes an X-ray source 61 and an analyzer 64 serving as an electrostatic hemispherical energy analyzer, and when an X-ray is irradiated on the surface of the sample 65 by the Xray source 61, the sample being arranged in a vacuum environment, photoelectrons emitted from a portion of the surface of the sample 65 irradiated with the X-ray enter the analyzer 64.

When the analyzer 64 measures energy distribution of the entered photoelectrons and transmits a measurement result to the main controller 8, the main controller 8 can display identification, a chemical bonding state, and the like of elements in the sample 65.

After the measurement, irradiation of the X-ray is stopped. A gas cluster ion beam that has passed through the focusing/deflecting tank 53 enters the sample chamber 62 and is irradiated on the sample 65, the surface of the sample 65 is sputtered, a new surface is exposed, and measurement by means of the X-ray source 61 and the analyzer 64 can be performed. In this manner, by repeating the surface analysis by means of the measurement apparatus 60 and the exposure of a new surface of the sample 65 by means of the gas cluster ion beam apparatus 2, information in terms of the depth profiling of the sample 65 can be obtained.

In the analyzing apparatus 12c in FIG. 4, the measurement apparatus 70 provided in the sample chamber 72 includes a primary ion gun 71 and an analyzer 74, and when primary ions are irradiated on the surface of the sample 75 by the primary ion gun 71, the sample 75 being arranged in a vacuum environment, secondary ions are emitted from a portion of the surface of the sample 75 irradiated with the primary ions and enter the analyzer 74. Here, the analyzer 74 is a time-of-flight secondary ion mass spectrometer, and when the secondary ions incident on the analyzer 74 are subjected to mass analysis by the analyzer 74, and a measurement result is transmitted to the main controller 8, the main controller 8 displays identification and a content rate of substances contained on the surface of the sample 75.

In the case of the analyzing apparatus 12c as well, since a gas cluster ion beam that has passed through the focusing/deflecting tank 53 enters the sample chamber 72 and is irradiated on the sample 75, the surface of the sample 75 is sputtered, and a new surface is exposed, information in terms of the depth profiling can be obtained.

Meanwhile, the above analyzing apparatus including the gas cluster ion beam apparatus is not limited to an analyzing apparatus using photoelectrons, such as an Auger electron spectroscopy analyzing apparatus, an Auger electron diffraction analyzing apparatus, and a Rutherford backscattering analyzing apparatus, and broadly includes an analyzing apparatus in which a surface of a sample is irradiated with a gas cluster ion beam to expose a new surface of the sample for analysis.

Heat conduction between the aforementioned nozzle support 13 and the ionization chamber 14 is blocked by the cooling body 18, and heat transfer to the nozzle support 13 due to the heat conduction from the ionization chamber 14 is prevented. However, when radiant heat emitted from the ionization chamber 14 reaches the nozzle support 13 through the passing hole 28 of the cooling body 18 and the through hole 27 of the skimmer 34, the nozzle support 13 is heated. Since the nozzle support 13 is exposed to a vacuum insulating environment, the temperature rises with time.

FIGS. 5A, 5B, 5C and 5D are graphs for describing effects of the gas heating device 15 of the gas cluster ion beam apparatus 2 in a case in which argon gas is used as source gas.

Figure 5A:
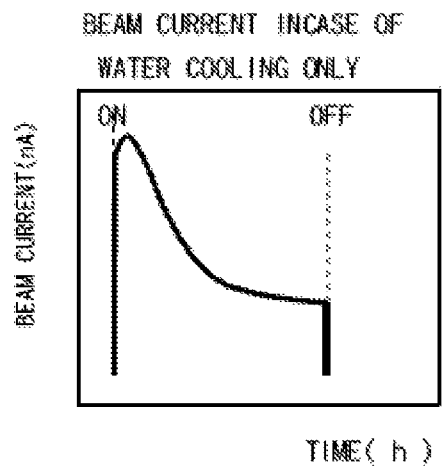
FIGS. 5A and 5B are graphs illustrating a relationship between a beam current value and time.
Figure 5B:
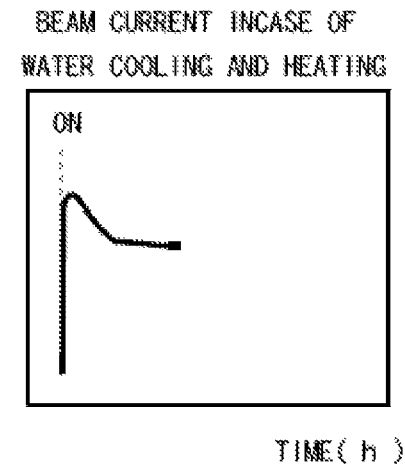

FIGS. 5A and 5B are graphs illustrating a relationship between energization time and a current value of the gas cluster ion beam in a case in which the time is described on the horizontal axis and in which the current value of the gas cluster ion beam current (beam current) is described on the vertical axis. FIG. 5A is a graph illustrating the relationship when the gas heating device 15 is stopped and the cooling body 18 is cooled by the cooling device 19, and FIG. 5B is a graph illustrating the relationship when both cooling of the cooling body 18 by the cooling device 19 and heating of the proximity portion 20 of the gas pipe 31 by the gas heating device 15 are performed.

When FIGS. 5A and 5B are compared, it can be read that a temporal change of the beam current value is smaller in FIG. 5B, and the effect of the temperature control by the gas heating device 15 can be seen.

Figure 5C:
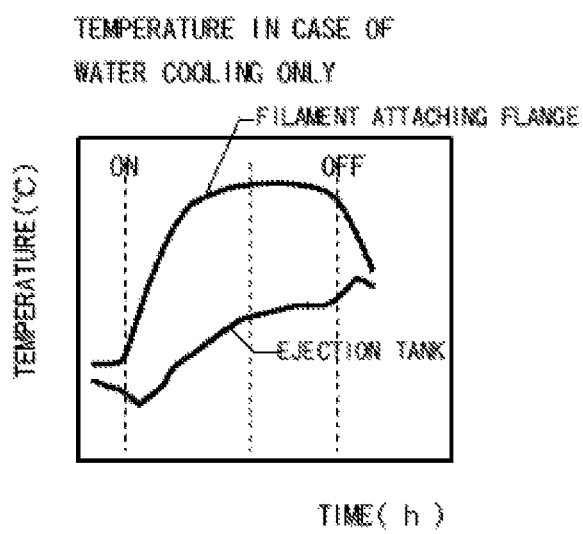
FIGS. 5C and 5D are graphs illustrating a relationship between a temperature of an ejection tank and a temperature of a flange to which an ionization filament is attached, and time.
Figure 5D:
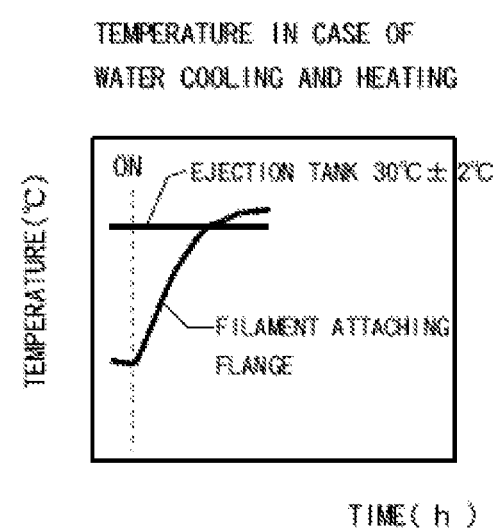

FIGS. 5C and 5D are graphs illustrating a relationship between time and temperature in a case in which the time is described on the horizontal axis and in which the temperature of a filament attaching flange and the temperature of the ejection tank are described on the vertical axis. Similarly to FIGS. 5A and 5B, FIG. 5C is a graph illustrating the relationship when the gas heating device 15 is stopped and the cooling body 18 is cooled by the cooling device 19, and FIG. 5D is a graph illustrating the relationship when both cooling of the cooling body 18 by the cooling device 19 and heating of the proximity portion 20 of the gas pipe 31 by the gas heating device 15 are performed. Although there is no difference in the temperature change of the filament attaching flange between FIGS. 5C and 5D, it is clear that the temperature fluctuation of the ejection tank is smaller in FIG. 5D.

Figure 6A:
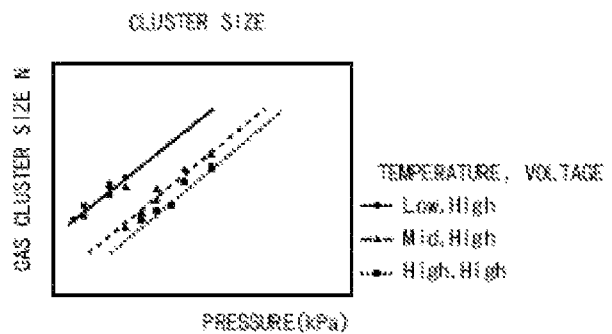
FIG. 6A is a graph illustrating a relationship between a gas cluster ion size and pressure.

FIG. 6A is a graph illustrating a relationship between the source gas pressure and a gas cluster size at different temperatures when the source gas pressure is described on the horizontal axis and the gas cluster size is described on the vertical axis. FIG. 6A illustrates that the gas cluster size is larger when the temperature is lower and the pressure is higher, that the gas cluster size is smaller when the temperature is higher and the pressure is lower.

Figure 6B:
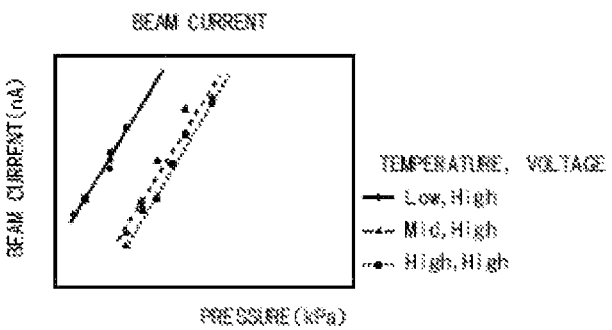
FIG. 6B is a graph illustrating a relationship between a beam current value and pressure.

FIG. 6B is a graph illustrating a relationship between source gas pressure and a beam current value at different temperatures when the source gas pressure is described on the horizontal axis and the beam current value is described on the vertical axis. FIG. 6B illustrates that the beam current value is higher when the temperature is lower and the pressure is higher, that the beam current value is lower when the temperature is higher and the pressure is lower.

Figure 7:
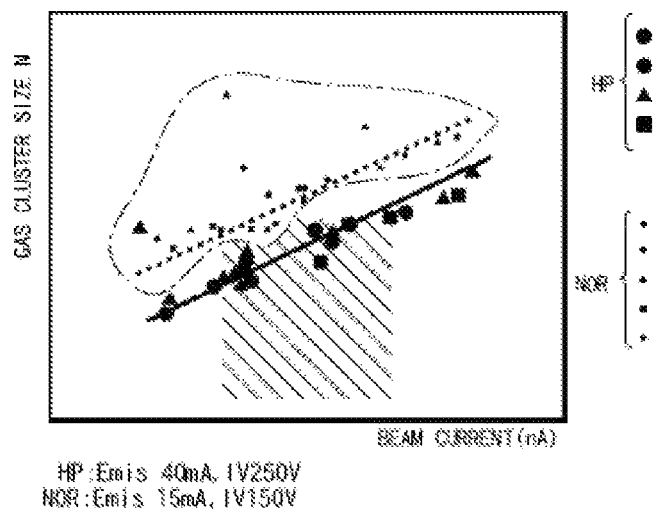
FIG. 7 is a graph illustrating a relationship between a current value of a gas cluster ion beam and a gas cluster ion size.

FIG. 7 is a graph illustrating a relationship between a beam current value and a gas cluster size at different ionization power values when the beam current value is described on the horizontal axis, and the gas cluster ion size is described on the vertical axis. The sign NOR indicates the relationship when ionization current is 15 mA and ionization voltage (IV) is 150V, and the sign HP indicates the relationship when the ionization current is 40 mA and the ionization voltage is 250V.

It can be seen that the gas cluster ion size is smaller when the input power for ionization (product of the ionization current and the ionization voltage) is higher.

A relationship between an Ar gas cluster ion size and a sputtering rate was measured. The measurement results are illustrated in Table 1 below.

TABLE 1

| COMPARISON OF SPUTTERING RATE | | | |
|---|---|---|---|
| GAS CLUSTER SIZE N (NUMBER OF ATOMS) | VOLTAGE OF ACCELERATION DEVICE (kV) | SPUTTERING RATE (nm/min) @ 1 nA, 1 × 1 mm$^2$ | SAMPLE |
| 450 | 20 | 1.3 | Si (SiO$_2$ 25 nm/Si) |
| 950 | 20 | 0.32 | SiO$_2$ (SiO$_2$ 100 nm/Si) |
| 2500 | 20 | 0.1 | SiO$_2$ (SiO$_2$ 25 nm/Si) |

It can be seen from Table 1 that the sputtering rate when the gas cluster size N is 450 is about ten times the sputtering rate when the gas cluster size N is 2500. However, in a case in which the source gas is Ar, the sputtering rate for Si is higher (faster) than the sputtering rate for SiO$_2$. Since the value of 1.3 nm/min when N is 450 is the sputtering rate for Si, and the value of 0.1 nm/min when N is 2500 is the sputtering rate for SiO$_2$, it is considered that the sputtering rate for SiO$_2$ when N is 450 is lower than the sputtering rate for Si. Also, since the beam current when N is 450 was about ¼ of the beam current when N is 2500, it is predicted that the sputtering rate for SiO$_2$ when N is 450 is about several times the sputtering rate of 2500 for SiO$_2$ when N is 2500.

Meanwhile, although both the cooling body 18 and the gas heating device 15 are provided in the above embodiment, providing either one of the cooling body 18 or the gas heating device 15 enables the intensity of the gas cluster ion beam to be stabilized more than in a case of a conventional apparatus.

What is claimed is:
1. An analyzing apparatus comprising:
a sample chamber configured to receive a sample;
a measurement apparatus configured to measure a physical quantity of a surface of the sample;
a gas cluster ion beam apparatus configured to emit a gas cluster ion beam on the sample, the gas cluster ion beam apparatus including:
an ionization chamber configured so that a gas cluster formed by ejecting source gas from an ejection hole of a nozzle supported by a nozzle support travels;
an ionization filament configured to emit thermoelectrons when heated and to irradiate the gas cluster travelling in the ionization chamber with the thermoelectrons so as to generate gas cluster ions;
a cooling body; the nozzle support and the ionization chamber being in contact with the cooling body, and separated from each other;
a cooling device configured to cool the cooling body to a predetermined temperature;
a gas pipe configured to supply the source gas to the nozzle;
a gas heating device configured to heat the source gas; and
a main controller configured to control the heat generation of the gas heating device,
wherein, while a temperature of the source gas ejected from the nozzle is controlled by the main controller, the gas cluster ion beam containing the generated gas cluster ions is ejected outside the ionization chamber and is irradiated on the sample arranged in the sample chamber.

2. The analyzing apparatus according to claim 1, wherein a temperature of the cooling body is controlled by the main controller.

3. The analyzing apparatus according to claim 1, further comprising a pressure controller configured to control a pressure of the source gas supplied to the nozzle.

4. The analyzing apparatus according to claim 1, further comprising:
a vacuum-exhausted ejection tank having the nozzle support; and
a vacuum-exhausted ionization tank having the ionization chamber, the ejection tank and the ionization tank not being in contact with each other, and each of the ejection tank and the ionization tank is in contact with the cooling body.

5. The analyzing apparatus according to claim 1, wherein a cooling medium cooled by the cooling device is circulated through the cooling body to cool the cooling body.

6. A gas cluster ion beam apparatus comprising:
an ionization chamber configured so that a gas cluster formed by ejecting source gas from an ejection hole of a nozzle supported by a nozzle support travels;
an ionization filament configured to emit thermoelectrons when heated and to irradiate the gas cluster travelling in the ionization chamber with the thermoelectrons so as to generate gas cluster ions;
a cooling body; the nozzle support and the ionization chamber being in contact with the cooling body, and separated from each other;
a cooling device configured to cool the cooling body to a predetermined temperature;
a gas pipe configured to supply the source gas to the nozzle;
a gas heating device configured to heat the source gas; and
a main controller configured to control the heat generation of the gas heating device,
wherein, while a temperature of the source gas ejected from the nozzle is controlled by the main controller, the gas cluster ion beam containing the generated gas cluster ions is ejected outside the ionization chamber and is irradiated on the sample arranged in the sample chamber.

7. The gas cluster ion beam apparatus according to claim 6, wherein a temperature of the cooling body is controlled by the main controller.

8. The gas cluster ion beam apparatus according to claim 6, further comprising a pressure controller configured to control a pressure of the source gas supplied to the nozzle.

9. The gas cluster ion beam apparatus according to claim 6, further comprising:
a vacuum-exhausted ejection tank having the nozzle support; and
a vacuum-exhausted ionization tank having the ionization chamber, the ejection tank and the ionization tank not being in contact with each other, and each of the ejection tank and the ionization tank is in contact with the cooling body.

10. The gas cluster ion beam apparatus according to claim 6, wherein a cooling medium cooled by the cooling device is circulated through the cooling body to cool the cooling body.

* * * * *